(12) United States Patent
Bal

(10) Patent No.: US 6,888,374 B2
(45) Date of Patent: May 3, 2005

(54) FPGA PERIPHERAL ROUTING WITH SYMMETRIC EDGE TERMINATION AT FPGA BOUNDARIES

(75) Inventor: Ankur Bal, Ghaziabad (IN)

(73) Assignee: STMicroelectronics Pvt. Ltd., Noida (IN)

( * ) Notice: Subject to any disclaimer, the term of this patent is extended or adjusted under 35 U.S.C. 154(b) by 113 days.

(21) Appl. No.: 10/464,420

(22) Filed: Jun. 17, 2003

(65) Prior Publication Data

US 2004/0036499 A1 Feb. 26, 2004

(30) Foreign Application Priority Data

Jun. 17, 2002 (IN) ........................................ 656/Del/2002

(51) Int. Cl.[7] .......................................... H03K 19/177
(52) U.S. Cl. .............................. 326/40; 326/41; 326/39
(58) Field of Search ............................ 326/40, 41, 39, 326/38

(56) References Cited

U.S. PATENT DOCUMENTS

| | | | | |
|---|---|---|---|---|
| 6,184,713 B1 | * | 2/2001 | Agrawal et al. | 326/40 |
| 6,204,689 B1 | | 3/2001 | Percey et al. | 326/41 |
| 6,285,211 B1 | * | 9/2001 | Sample et al. | 326/40 |
| 6,320,411 B1 | * | 11/2001 | Mendel | 326/40 |
| 6,577,158 B2 | * | 6/2003 | Gupta | 326/40 |
| 6,624,771 B2 | * | 9/2003 | Bal | 341/106 |
| 6,642,743 B2 | * | 11/2003 | Bal | 326/38 |
| 6,646,465 B2 | * | 11/2003 | Bal | 326/40 |

\* cited by examiner

*Primary Examiner*—Michael Tokar
*Assistant Examiner*—Lam T. Mai
(74) *Attorney, Agent, or Firm*—Lisa K. Jorgenson; Robert Iannucci; Seed IP Law Group PLLC

(57) ABSTRACT

An FPCA includes a scheme for peripheral routing that provides symmetrical routing across its entire area including the periphery by incorporating peripheral routing lines of equal length that are symmetrically deflected orthogonally. The symmetrical peripheral routing lines are connected to switch boxes and connection boxes at the periphery for maintaining constant routing channel width.

15 Claims, 5 Drawing Sheets

FPGA PERIPHERAL ROUTING WITH SYMMETRIC EDGE TERMINATION AT FPGA BOUNDARIES

BACKGROUND OF THE INVENTION

1. Field of the Invention

This invention relates to a Field Programmable Gate Array (FPGA) incorporating peripheral routing with symmetrical edge termination at the boundaries. The invention also relates to a method for incorporating symmetrical edge termination at FPGA chip boundaries.

2. Description of the Related Art

FPGAs are programmable devices containing an array of programmable logic blocks connectable by programmable routing resources. IO pads at the chip periphery can interact with the core logic. The FPGA can be programmed to implement a wide range of circuits providing a large variety of designs. The efficiency of the implementation in terms of area and speed depends not only on the FPGA architecture, but also largely on effectiveness of the physical layout and interconnections. Automated software tools, known as automated Place & Route, define the connectivity provided by programmable interconnections. The automated Place & Route is a complex activity. An FPGA architecture that facilitates this activity can have a very considerably influence the quality of the output produced. A good architecture exploitable by the software is ideal. Symmetric architectures aid in the development of efficient software algorithms.

The problem of maintaining of symmetry is acute in the regions neighboring the chip periphery. The worst affected is the routing architecture. The Xilinx Virtex device attempts to correct this problem by reflecting back the lines hitting the edge [12] as shown in FIG. 1. This approach successfully maintains constant channel width in the FPGA. But at the same time two other changes occur:

1. A new switching module [11] is required to be defined at the periphery.
2. The segments no longer adhere to the properties demonstrated in the core.

A peripheral routing channel [13] is also introduced that is different from the core channel. These changes present new architectural components to be modeled by the software. These requirements introduce considerable complexities in the software algorithm resulting in inefficiencies and delays.

The XC 4000 architecture is relatively simple with a connection box interfacing the terminating core routing channel to the peripheral segments. Moreover, the XC 4000 routing employs single length line segments.

BRIEF SUMMARY OF THE INVENTION

An embodiment of this invention overcomes these drawbacks and provide an FPGA device that maintains symmetry in the interconnection routing even at the periphery. The FPGA establishes predictable and uniform routing delays and reduces the schematic and layout design time of the FPGA owing to the virtue of a uniform tile.

An embodiment of the invention provides a scheme for peripheral routing that provides symmetrical routing across its entire area including the periphery by incorporating peripheral routing lines of equal length that are symmetrically deflected orthogonally. The symmetrical peripheral routing lines are connected to switch boxes and connection boxes at the periphery for maintaining constant routing channel width.

BRIEF DESCRIPTION OF THE DRAWINGS

The objects and advantages of the invention will become more apparent in reference to the following description and the accompanying drawings, wherein.

DETAILED DESCRIPTION OF THE INVENTION

A basic FPGA architecture comprising PLBs (Programmable Logic Blocks), switch boxes, and connection boxes has been described in the present embodiment. However it will be apparent to a person of ordinary skill in the art that the description is applicable to more complex architectures as well.

Figure 1:
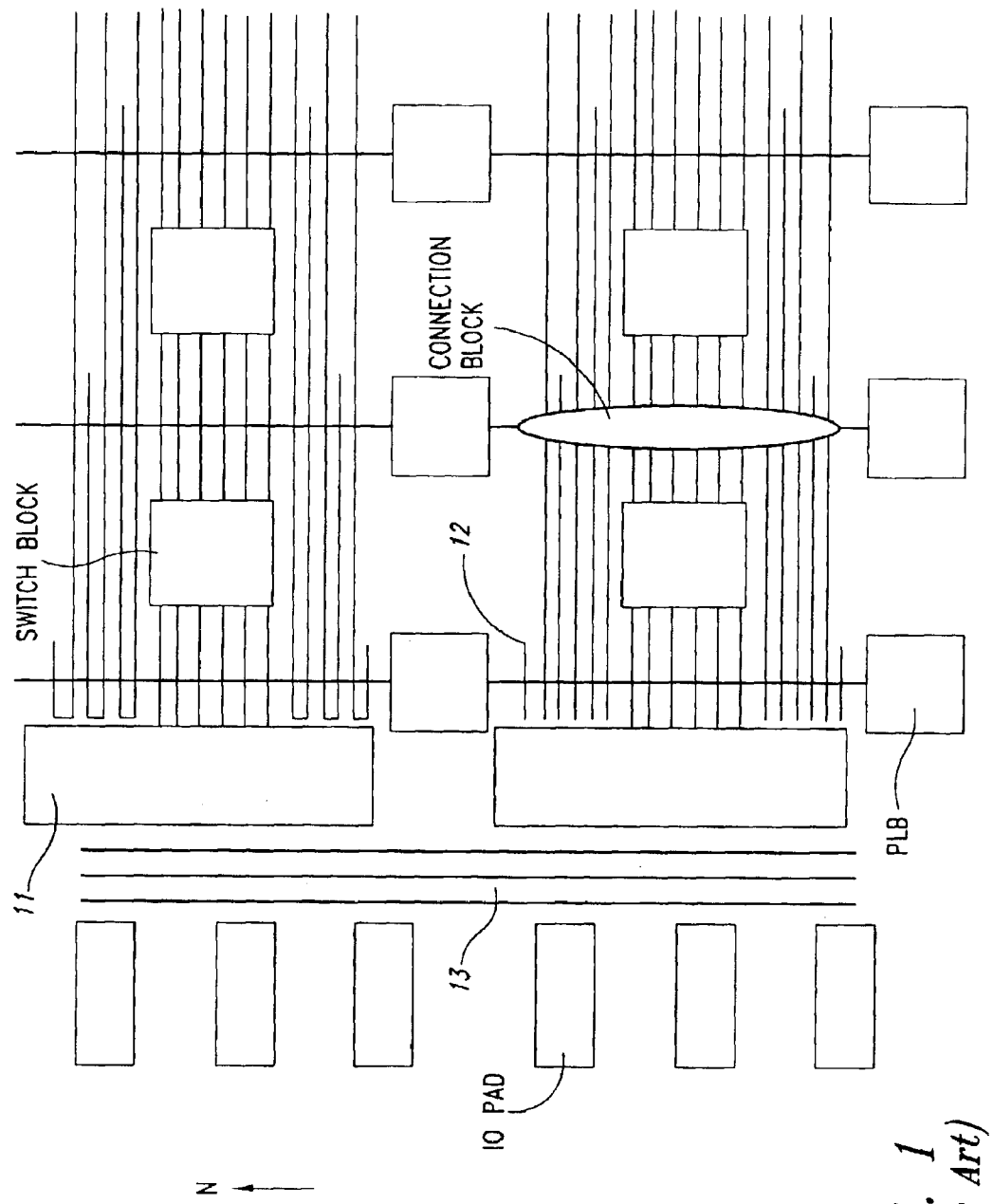
FIG. 1 shows peripheral routing according to the prior art.
Figure 2:
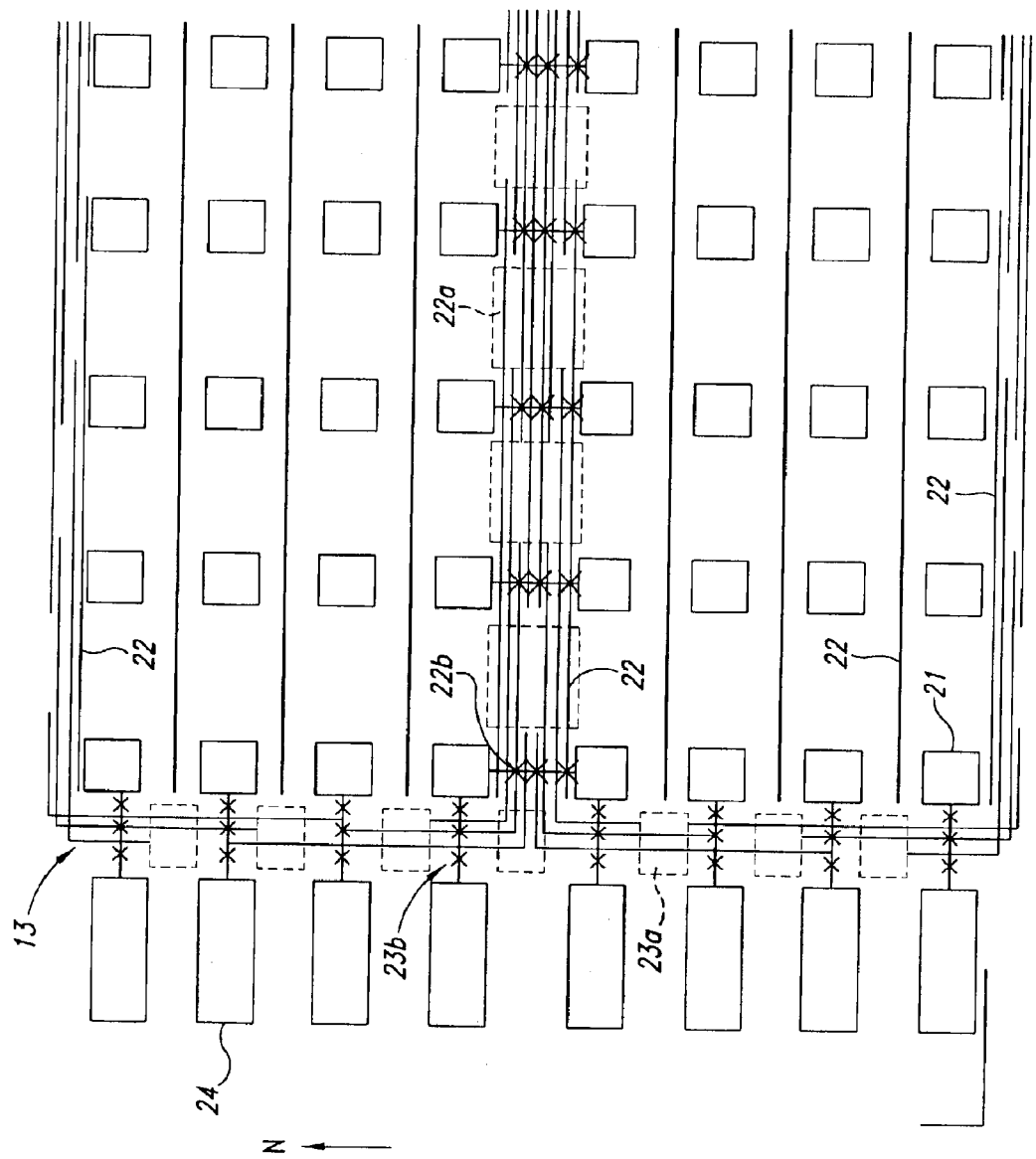
FIG. 2 shows vertical edge section of an FPGA according to the prior art

FIG. 2 illustrates a vertical edge section of an FPGA. The FPGA includes an array of PLBs 21, conductive routing segments 22, core architecture switch boxes 22a, peripheral switch boxes 23a, core architecture connection boxes 22b, peripheral connection boxes 23b, and input/output (IO) pads 24 connected to each other to realize a programmable device. The segments [22] are staggered in the peripheral channel 13 for increased routing flexibility. Segments 22 start and finish at switch boxes [22a, 23a]. Line segments spanning more than one PLB tend to cause asymmetry in the channel close to the periphery. As it will become apparent, this asymmetry is directly proportional to the composition of the channel. The segment length of the segments 22 constituting the channel chiefly contributes to the irregularities seen at the edge. The segment length in the present embodiment is kept at four quad lines (segments spanning four PLB faces), which doesn't necessarily imply spanning of four PLBs. The PLB sides traversed may be of the same PLB. As the segments approach the edge, they tend to extend beyond the last PLB. For instance, a quad line emerging from a switch box adjacent to the last PLB would tend to finish at a switch box 4 PLB sides away. Due to non-existence of such a PLB the line would end abruptly or would have to be done away with. This would lead to an unbalanced architecture.

The present invention maintains architectural symmetry by orthogonal deflection of the segment lines to produce orthogonally deflected segments 23. The lines 23 are symmetrically deflected in the two possible orthogonal directions opposite to each other. In the embodiment shown in FIG. 3, each of the peripheral switch boxes 23a includes a west side 23aW at which two segments 23 are connected, respectively. The segments exit the west side 23aW of the switch box 23a in a westerly direction for a small distance and then are deflected orthogonally in opposite directions: one segment 23 being deflected to the north and the other being deflected to the south.

Figure 4:
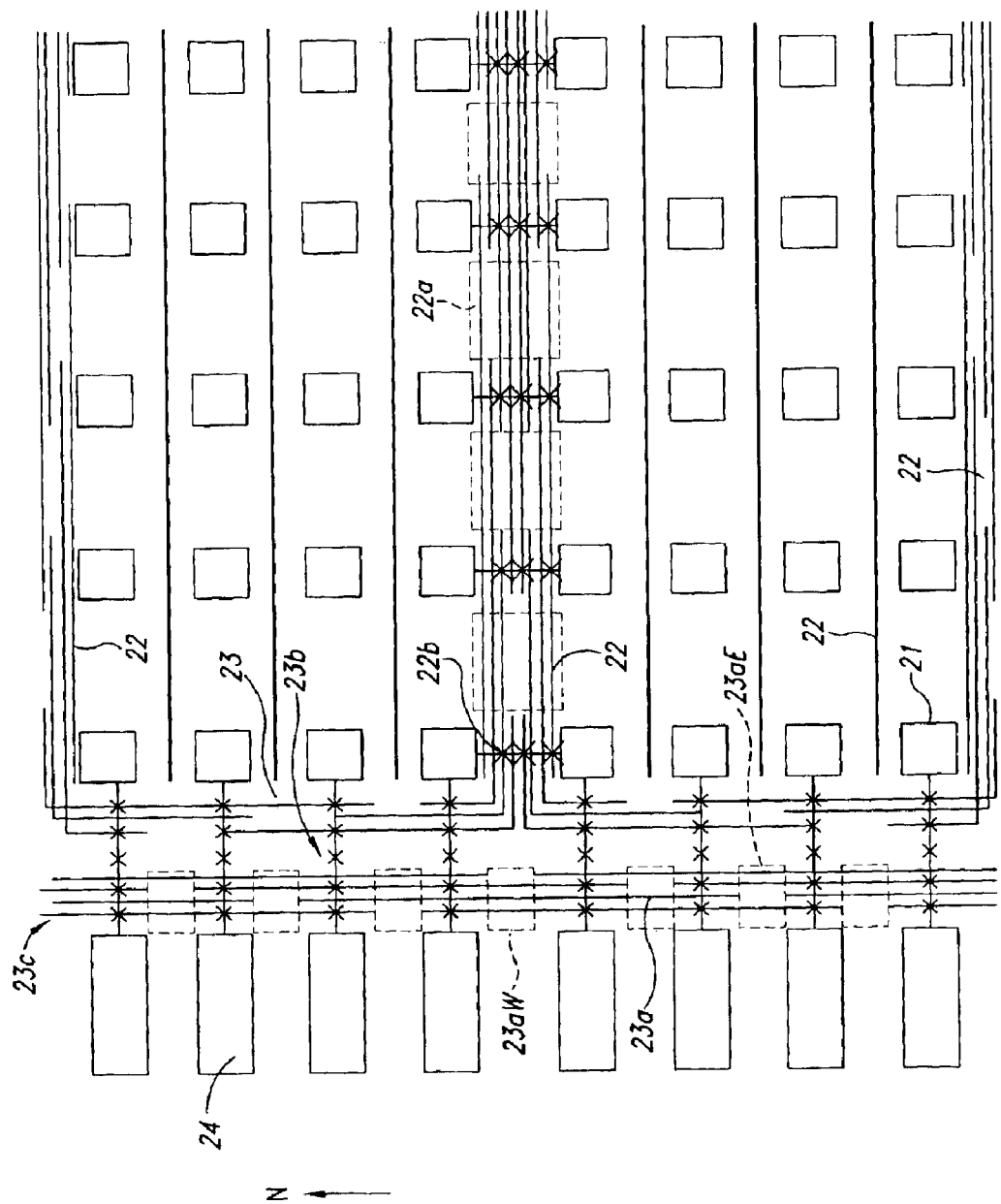
FIG. 4 shows a second embodiment of peripheral routing according to the present invention.

In the embodiment of FIG. 4, each peripheral switch box 23a still is connected to two segments 23 extending in opposite directions. However, in FIG. 4, the two segments 23 exit from the north and south sides of the switch box 23a, respectively.

Figure 3:
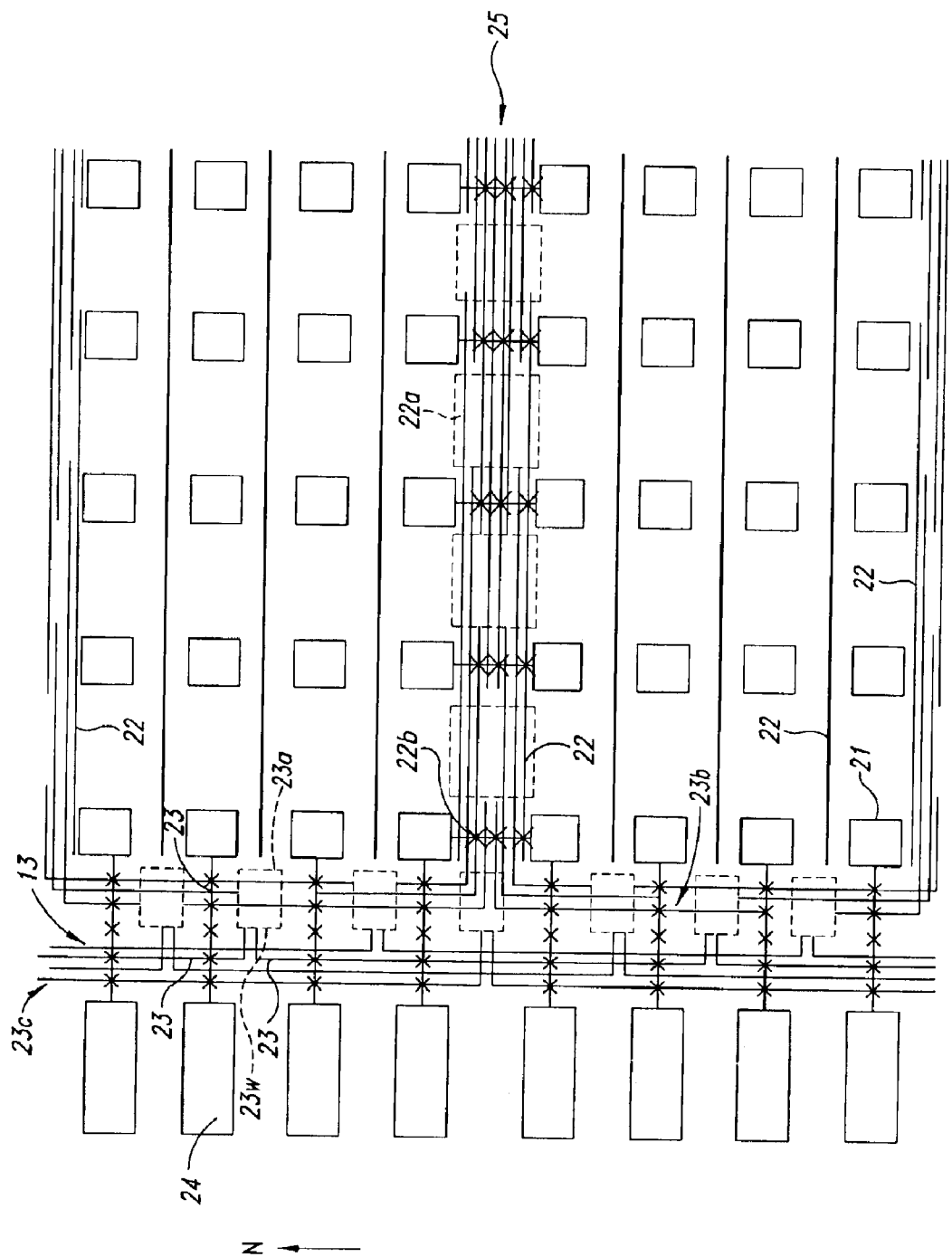
FIG. 3 shows an embodiment peripheral routing according to the present invention.

The line segments retain their property of spanning four PLBs. As shown in FIG. 3 and FIG. 4 in the preferred embodiment, one IO pad [24] is associated per PLB tile. The implementation exploits the concept of virtual depth by visualizing IO pad [24] and the PLBs along the edge as PLBs in a virtual array extending beyond the edge. For example, a track originating from a switch box adjoining the PLB on the west edge and turning northwards may be virtually re-constructed by unfolding the bent line westward. The IOs and the abutting PLBs facing the IOs are then visualized as logic blocks extending beyond the edge.

The switch box and connection box topologies can be retained from the core after inserting some lines in the channel induced at the periphery so as to maintain constant channel width. As shown in FIG. 4 side (23aW) of a switch box at the periphery has its side facing the chip edge removed, but this does not have any adverse impact on its topology. A minor change in the connection box topology of the IO pads interfacing with the so-formed peripheral routing might arise due to differences between the PLB & IO ports tapping the channel. However, the entire structure is a highly symmetrical, closed, well-knit peripheral routing framework.

A common requirement is to have a peripheral channel 13 wider than the core routing channel 25. FIGS. 3 and 4 delineate two of the many possible schemes to widen the peripheral channel in accordance with the invention. In FIG. 3, the side of each of the switch boxes 23a facing the edge is utilized to induce a supplementary channel [23b]. In FIG. 4, the bent segments are not terminated at a switch box. A 3-sided switch box [23a] accommodates the extra lines in two of its three sides. One of its sides [23aE] acts as a receptor of lines ending from the channel [22], similar to that shown in FIG. 3, but not shown in FIG. 4 for simplicity. Connection boxes 23b for IO pad and PLB interface are inserted between the peripheral switch boxes [23a].

Figure 5:
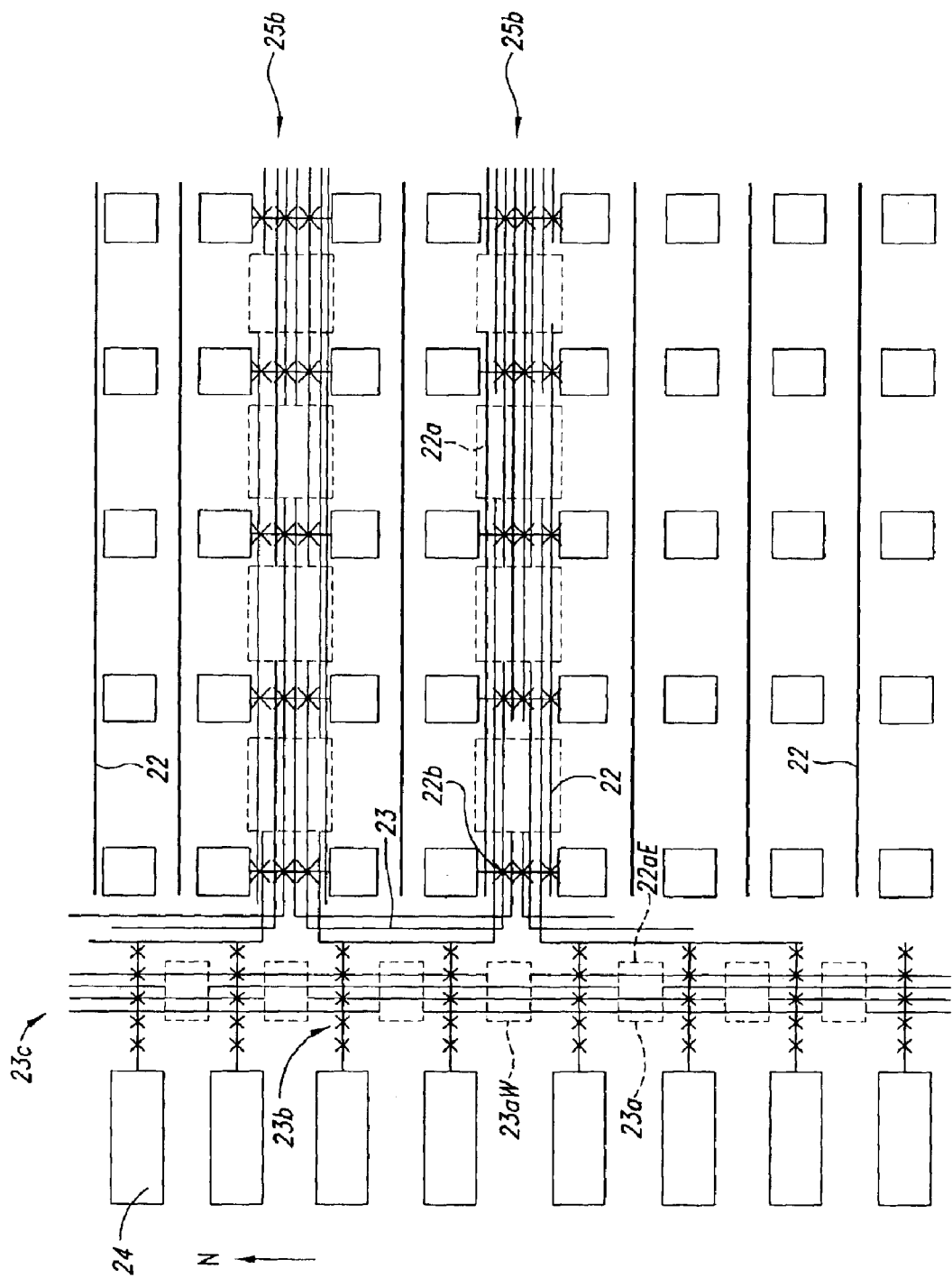
FIG. 5 shows a third embodiment of peripheral routing according to the present invention

Another embodiment illustrated in FIG. 5 accomplishes the object of the invention by merging lines 23 deflected from adjacent core channels 25a, 25b. The lines are merged in a manner to retain their common segment length of four, although other common segment lengths could be employed. In FIG. 5, a quad line is redefined as a segment spanning four PLBs, and not PLB sides as stated in earlier embodiments. An auxiliary channel 25c is also introduced with properties similar to the one in FIG. 4.

As will be appreciated by those skilled in the art, the proposed peripheral routing scheme results in a highly symmetric, easy to build architecture with low complexity in all domains. Many more embodiments are possible in the light and spirit of the present invention. For example, line segments of lengths other than four in a channel can be handled effectively in other possible embodiments. A line segment can be redefined to suit a particular architecture with the re-characterization altering the PLBs spanned by a segment at the periphery.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

That which is claimed is:

1. A Field Programmable Gate Array (FPGA) providing symmetrical routing across its entire area including a periphery, comprising:
   peripheral routing lines of equal length that are symmetrically deflected orthogonally; and
   switch boxes and connection boxes positioned at the periphery and connected to the peripheral routing lines, for maintaining constant routing channel width.

2. A Field Programmable Gate Array (FPGA) as claimed in claim 1, further comprising a plurality of programmable logic blocks (PLB), wherein the peripheral routing lines are quad lines that span four PLB sides.

3. A Field Programmable Gate Array (FPGA) as claimed in claim 1, further comprising a plurality of channels, wherein deflected routing lines from adjacent channels are merged and have the equal length.

4. A Field Programmable Gate Array (FPGA) as claimed in claim 1 wherein the connection boxes are positioned between the peripheral switch boxes.

5. A method for providing symmetrical routing across an entire area, including a periphery, of an FPGA, comprising the steps of:
   symmetrically deflecting peripheral routing lines of equal length orthogonally; and
   connecting switch boxes and connection boxes at the periphery, for maintaining constant routing channel width.

6. The method of claim 5 wherein the peripheral routing lines are quad lines that span four PLB sides.

7. The method of claim 5, further including merging deflected routing lines from adjacent channels in a manner that retains the equal length of the lines.

8. The method of claim 5 wherein the connection boxes are positioned between the peripheral switch boxes.

9. A field programmable gate array, comprising:
   an array of programmable logic boxes;
   a plurality of switch boxes positioned outside of the array and in a peripheral channel; and
   a plurality of peripheral routing lines positioned in the peripheral channel and connected to the switch boxes, each of the switch boxes being connected to respective first and second routing lines, of the plurality of routing lines, that symmetrically extend in opposite directions from each other.

10. The field programmable gate array of claim 9 wherein each of the routing lines of the plurality are of equal length.

11. The field programmable gate array of claim 9 wherein the first and second routing lines both extend in a first direction from a side of one of the switch boxes, the first routing line being deflected in a second direction transverse to the first direction, and the second routing line being deflected in a third direction transverse to the first direction and opposite to the second direction.

12. The field programmable gate array of claim 9 wherein the peripheral routing lines are quad lines that span four sides of the programmable logic blocks.

13. The field programmable gate array of claim 9, wherein the array of programmable logic blocks include a plurality of core channels extending between groups of the programmable logic blocks, the field programmable gate array further comprising a core routing line that extends from a first one of the core channels into the peripheral channel and into a second one of the core channels.

14. The field programmable gate array of claim 9 wherein the core routing line and the peripheral routing lines have equal lengths.

15. The field programmable gate array of claim 9, further comprising connection boxes positioned between the switch boxes and connected to the routing lines.

* * * * *